(12) United States Patent
Sung

(10) Patent No.: US 8,753,911 B2
(45) Date of Patent: *Jun. 17, 2014

(54) DIAMOND LED DEVICES AND ASSOCIATED METHODS

(71) Applicant: Chien-Min Sung, Tansui (TW)

(72) Inventor: Chien-Min Sung, Tansui (TW)

(73) Assignee: RiteDia Corporation, Hsin Chu Industrial Park (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/676,037

(22) Filed: Nov. 13, 2012

(65) Prior Publication Data

US 2013/0178007 A1    Jul. 11, 2013

Related U.S. Application Data

(60) Division of application No. 12/755,034, filed on Apr. 6, 2010, now Pat. No. 8,309,967, which is a continuation-in-part of application No. 12/686,288, filed on Jan. 12, 2010, now Pat. No. 7,867,802, which is a division of application No. 11/809,720, filed on May 31, 2007, now Pat. No. 7,646,025.

(51) Int. Cl.
  *H01L 21/00*    (2006.01)
(52) U.S. Cl.
  USPC ............................... 438/46; 438/47; 438/105
(58) Field of Classification Search
  USPC ............................. 438/46, 47, 105
  See application file for complete search history.

(56) References Cited

U.S. PATENT DOCUMENTS

| 4,981,818 A | 1/1991 | Anthony et al. |
| 5,272,355 A | 12/1993 | Namavar et al. |
| 5,276,338 A | 1/1994 | Beyer et al. |
| 5,294,814 A | 3/1994 | Das |
| 5,389,799 A | 2/1995 | Uemoto |
| 5,471,946 A | 12/1995 | Scholz et al. |

(Continued)

FOREIGN PATENT DOCUMENTS

JP    08008484    1/1996

OTHER PUBLICATIONS

U.S. Appl. No. 13/220,451, filed Aug. 29, 2011; Chien-Min Sung; office action dated Jan. 14, 2013.

(Continued)

*Primary Examiner* — Ngan Ngo
(74) *Attorney, Agent, or Firm* — Thorpe North & Western LLP

(57) ABSTRACT

LED devices incorporating diamond materials and methods for making such devices are provided. One such method may include forming epitaxially a substantially single crystal SiC layer on a substantially single crystal Si wafer, forming epitaxially a substantially single crystal diamond layer on the SiC layer, doping the diamond layer to form a conductive diamond layer, removing the Si wafer to expose the SiC layer opposite to the conductive diamond layer, forming epitaxially a plurality of semiconductor layers on the SiC layer such that at least one of the semiconductive layers contacts the SiC layer, and coupling an n-type electrode to at least one of the semiconductor layers such that the plurality of semiconductor layers is functionally located between the conductive diamond layer and the n-type electrode.

5 Claims, 2 Drawing Sheets

(56) References Cited

U.S. PATENT DOCUMENTS

| | | |
|---|---|---|
| 5,667,586 A | 9/1997 | Ek et al. |
| 7,033,912 B2 | 4/2006 | Saxler |
| 7,115,915 B2 | 10/2006 | Shei et al. |
| 7,646,025 B1 | 1/2010 | Sung |
| 7,867,802 B2 * | 1/2011 | Sung ............................ 438/46 |
| 7,880,377 B2 | 2/2011 | Orita et al. |
| 2004/0072383 A1 | 4/2004 | Nagahama et al. |
| 2006/0099730 A1 | 5/2006 | Lee et al. |
| 2006/0113546 A1 | 6/2006 | Sung |
| 2006/0255341 A1 | 11/2006 | Pinnington et al. |
| 2006/0284195 A1 | 12/2006 | Nagai |
| 2007/0170458 A1 | 7/2007 | Mitani et al. |
| 2008/0181275 A1 | 7/2008 | Matsuyama et al. |
| 2008/0296609 A1 | 12/2008 | Nagahama et al. |
| 2008/0299710 A1 | 12/2008 | Tombler et al. |
| 2008/0302418 A1 | 12/2008 | Buller et al. |
| 2009/0042328 A1 | 2/2009 | Niki et al. |
| 2010/0052112 A1 | 3/2010 | Rogers et al. |
| 2012/0012169 A1 | 1/2012 | Sung |

OTHER PUBLICATIONS

U.S. Appl. No. 13/682,233, filed Nov. 20, 2012; Chien-Min Sung; office action dated Jun. 7, 2013.

U.S. Appl. No. 13/220,451, filed Aug. 29, 2011; Chien-Min Sung; office action dated Jul. 25, 2013.

* cited by examiner

DIAMOND LED DEVICES AND ASSOCIATED METHODS

PRIORITY DATA

This application is a divisional of U.S. patent application Ser. No. 12/755,034, filed on Apr. 6, 2010, which is a continuation-in-part of U.S. patent application Ser. No. 12/686,288, filed on Jan. 12, 2010, which is a divisional of U.S. patent application Ser. No. 11/809,720, filed on May 31, 2007, now issued as U.S. Pat. No. 7,646,025, each of which are incorporated herein by reference.

FIELD OF THE INVENTION

The present invention relates generally to semiconductor devices and associated methods. Accordingly, the present invention involves the electrical and material science fields.

BACKGROUND OF THE INVENTION

In many developed countries, major portions of the populations consider electronic devices to be integral to their lives. Such increasing use and dependence has generated a demand for electronics devices that are smaller and faster. As electronic circuitry increases in speed and decreases in size, cooling of such devices becomes problematic.

Electronic devices generally contain printed circuit boards having integrally connected electronic components that allow the overall functionality of the device. These electronic components, such as processors, transistors, resistors, capacitors, light-emitting diodes (LEDs), etc., generate significant amounts of heat. As it builds, heat can cause various thermal problems associated with such electronic components. Significant amounts of heat can affect the reliability of an electronic device, or even cause it to fail by, for example, causing burn out or shorting both within the electronic components themselves and across the surface of the printed circuit board. Thus, the buildup of heat can ultimately affect the functional life of the electronic device. This is particularly problematic for electronic components with high power and high current demands, as well as for the printed circuit boards that support them.

Various cooling devices have been employed such as fans, heat sinks, Peltier and liquid cooling devices, etc., as means of reducing heat buildup in electronic devices. As increased speed and power consumption cause increasing heat buildup, such cooling devices generally must increase in size to be effective and may also require power to operate. For example, fans must be increased in size and speed to increase airflow, and heat sinks must be increased in size to increase heat capacity and surface area. The demand for smaller electronic devices, however, not only precludes increasing the size of such cooling devices, but may also require a significant size decrease.

As a result, methods and associated devices are being sought to provide adequate cooling of electronic devices while minimizing size and power constraints placed on such devices due to cooling.

SUMMARY OF THE INVENTION

Accordingly, the present invention provides semiconductor devices having improved thermal properties and methods for making such devices. In one aspect, for example, an LED device is provided having a conductive diamond layer, a SiC layer coupled to the diamond layer, a plurality of semiconductor layers, at least one of which is coupled to the SiC layer, and an n-type electrode coupled to at least one of the plurality of semiconductor layers, where the conductive diamond layer and the n-type electrode are arranged such that there is a substantially linear conductive pathway therebetween. Although numerous configurations for semiconductor layers are contemplated, in one aspect the plurality of semiconductor layers is arranged in series between the conductive diamond layer and the n-type electrode. Depending on the various techniques used to deposit a material, the crystal lattice of the SiC layer may be epitaxially coupled or matched to the crystal lattice of the conductive diamond layer. Additionally, the crystal lattice of the SiC layer may be epitaxially coupled or matched to the crystal lattice of at least one of the semiconductor layers.

Numerous semiconductor materials may be utilized in the construction of such a semiconductor device, depending on the intended application of the device. For example, in one aspect the semiconductor material may include at least one of silicon germanium, gallium arsenide, gallium nitride, germanium, zinc sulfide, gallium phosphide, gallium antimonide, gallium indium arsenide phosphide, aluminum phosphide, aluminum arsenide, aluminum gallium arsenide, gallium nitride, boron nitride, aluminum nitride, indium arsenide, indium phosphide, indium antimonide, indium nitride, and combinations thereof.

In another aspect, the semiconductor material may include at least one of gallium nitride, boron nitride, aluminum nitride, indium nitride, and combinations thereof. In a more specific aspect, the semiconductor material may include gallium nitride. In another more specific aspect, the semiconductor material may include aluminum nitride.

The conductive diamond layers according to aspects of the present invention may vary widely depending on the intended application of the device. For example, in one aspect the conductive diamond layer may be a single crystal or substantially a single crystal. In another aspect, the conductive diamond layer may be a conductive adynamic diamond layer. Additionally, in some applications it may be beneficial for the conductive diamond layer to be substantially transparent.

Various techniques may be employed to render a diamond layer conductive. For example, various impurities may be doped into the crystal lattice of the diamond layer. Such impurities may include elements such as Si, B, P, N, Li, Al, Ga, etc. In one specific aspect, for example, the diamond layer may be doped with B. Impurities may also include metallic particles within the crystal lattice, provided they do not interfere with the function of the device, such as by blocking light emitted from an LED.

The present invention additionally provides methods for making LED devices. In one aspect such a method may include forming epitaxially a substantially single crystal SiC layer on a substantially single crystal Si wafer, forming epitaxially a substantially single crystal diamond layer on the SiC layer, doping the diamond layer to form a conductive diamond layer, removing the Si wafer to expose the SiC layer opposite to the conductive diamond layer, forming epitaxially a plurality of semiconductor layers on the SiC layer such that at least one of the semiconductive layers contacts the SiC layer, and coupling an n-type electrode to at least one of the semiconductor layers such that the plurality of semiconductor layers is functionally located between the conductive diamond layer and the n-type electrode.

Various techniques may be utilized for the epitaxial deposition of the diamond layer on the SiC layer. For example, in one aspect forming an epitaxial diamond layer may further include grading a growth surface of the Si wafer from Si to SiC to form the SiC layer, and grading a growth surface of the SiC layer from SiC to diamond to form the diamond layer. In another aspect, forming an epitaxial layer of single crystal SiC may further include forming a conformal amorphous diamond layer on a single crystal Si wafer to form the SiC layer in situ therebetween, removing the conformal amorphous diamond layer to expose the SiC layer. Following removal of the conformal amorphous diamond layer the conductive diamond layer may be formed on the exposed SiC layer.

The present invention also provides LED devices having a conductive diamond substrate, a substantially single crystal SiC layer coupled to the diamond substrate, a plurality of semiconductor layers epitaxially coupled to the SiC layer, and an n-type electrode coupled to at least one of the semiconductor layers, such that the plurality of semiconductor layers is functionally located between the conductive diamond layer and the n-type electrode.

There has thus been outlined, rather broadly, various features of the invention so that the detailed description thereof that follows may be better understood, and so that the present contribution to the art may be better appreciated. Other features of the present invention will become clearer from the following detailed description of the invention, taken with the accompanying claims, or may be learned by the practice of the invention.

DETAILED DESCRIPTION OF THE INVENTION

Definitions

Figure 1:
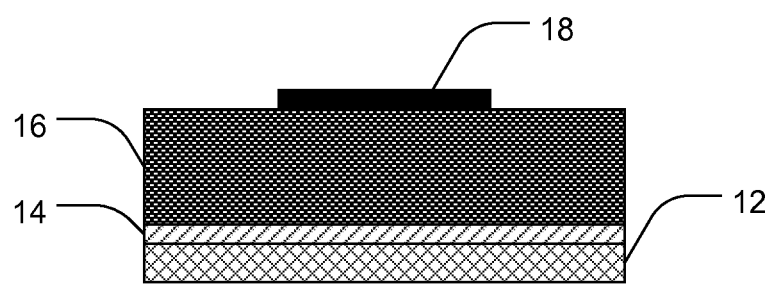
FIG. 1 is a cross-section view of an LED device being constructed in accordance with one embodiment of the present invention.

In describing and claiming the present invention, the following terminology will be used in accordance with the definitions set forth below.

The singular forms "a," "an," and, "the" include plural referents unless the context clearly dictates otherwise. Thus, for example, reference to "a heat source" includes reference to one or more of such sources, and reference to "the diamond layer" includes reference to one or more of such layers.

The terms "heat transfer," "heat movement," and "heat transmission" can be used interchangeably, and refer to the movement of heat from an area of higher temperature to an area of cooler temperature. It is intended that the movement of heat include any mechanism of heat transmission known to one skilled in the art, such as, without limitation, conductive, convective, radiative, etc.

As used herein, the term "emitting" refers to the process of moving heat or light from a solid material into the air.

As used herein, "light-emitting surface" refers to a surface of a device or object from which light is intentionally emitted. Light may include visible light and light within the ultraviolet spectrum. An example of a light-emitting surface may include, without limitation, a semiconductor layer of an LED, or of semiconductor layers to be incorporated into an LED, from which light is emitted.

As used herein, "linear conductive pathway" refers to a conductive pathway that is located along a straight line between two electrodes.

As used herein, "vapor deposited" refers to materials which are formed using vapor deposition techniques. "Vapor deposition" refers to a process of forming or depositing materials on a substrate through the vapor phase. Vapor deposition processes can include any process such as, but not limited to, chemical vapor deposition (CVD) and physical vapor deposition (PVD). A wide variety of variations of each vapor deposition method can be performed by those skilled in the art. Examples of vapor deposition methods include hot filament CVD, rf-CVD, laser CVD (LCVD), laser ablation, conformal diamond coating processes, metal-organic CVD (MOCVD), sputtering, thermal evaporation PVD, ionized metal PVD (IMPVD), electron beam PVD (EBPVD), reactive PVD, and the like.

As used herein, "chemical vapor deposition," or "CVD" refers to any method of chemically forming or depositing diamond particles in a vapor form upon a surface. Various CVD techniques are well known in the art.

As used herein, "physical vapor deposition," or "PVD" refers to any method of physically forming or depositing diamond particles in a vapor form upon a surface. Various PVD techniques are well known in the art.

As used herein, "diamond" refers to a crystalline structure of carbon atoms bonded to other carbon atoms in a lattice of tetrahedral coordination known as $sp^3$ bonding. Specifically, each carbon atom is surrounded by and bonded to four other carbon atoms, each located on the tip of a regular tetrahedron. Further, the bond length between any two carbon atoms is 1.54 angstroms at ambient temperature conditions, and the angle between any two bonds is 109 degrees, 28 minutes, and 16 seconds although experimental results may vary slightly. The structure and nature of diamond, including its physical and electrical properties are well known in the art.

As used herein, "distorted tetrahedral coordination" refers to a tetrahedral bonding configuration of carbon atoms that is irregular, or has deviated from the normal tetrahedron configuration of diamond as described above. Such distortion generally results in lengthening of some bonds and shortening of others, as well as the variation of the bond angles between the bonds. Additionally, the distortion of the tetrahedron alters the characteristics and properties of the carbon to effectively lie between the characteristics of carbon bonded in $sp^3$ configuration (i.e. diamond) and carbon bonded in $sp^2$ configuration (i.e. graphite). One example of material having carbon atoms bonded in distorted tetrahedral bonding is amorphous diamond.

As used herein, "diamond-like carbon" refers to a carbonaceous material having carbon atoms as the majority element, with a substantial amount of such carbon atoms bonded in distorted tetrahedral coordination. Diamond-like carbon (DLC) can typically be formed by PVD processes, although CVD or other processes could be used such as vapor deposition processes. Notably, a variety of other elements can be included in the DLC material as either impurities, or as dopants, including without limitation, hydrogen, sulfur, phosphorous, boron, nitrogen, silicon, tungsten, etc.

As used herein, "amorphous diamond" refers to a type of diamond-like carbon having carbon atoms as the majority element, with a substantial amount of such carbon atoms bonded in distorted tetrahedral coordination. In one aspect, the amount of carbon in the amorphous diamond can be at least about 90%, with at least about 20% of such carbon being bonded in distorted tetrahedral coordination. Amorphous diamond also has a higher atomic density than that of diamond (176 atoms/cm³). Further, amorphous diamond and diamond materials contract upon melting.

As used herein, "adynamic" refers to a type of layer which is unable to independently retain its shape and/or strength. For example, in the absence of a mold or support layer, an adynamic diamond layer will tend to curl or otherwise deform when the mold or support surface is removed. While a number of reasons may contribute to the adynamic properties of a layer, in one aspect, the reason may be the extreme thinness of the layer.

As used herein, "growth side," and "grown surface" may be used interchangeably and refer to the surface of a film or layer which is grows during a CVD process.

As used herein, "substrate" refers to a support surface to which various materials can be joined in forming a semiconductor or semiconductor-on-diamond device. The substrate may be any shape, thickness, or material, required in order to achieve a specific result, and includes but is not limited to metals, alloys, ceramics, and mixtures thereof. Further, in some aspects, the substrate may be an existing semiconductor device or wafer, or may be a material which is capable of being joined to a suitable device.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

The Invention

The present invention provides semiconductor devices having incorporated diamond layers and methods of making such devices. Semiconductor devices are often challenging to cool, particularly those that emit light. It should be noted that, even though much of the following description is devoted to light emitting devices such as LEDs, the scope of the claims of the present invention should not be limited thereby and that such teachings are equally applicable to other types of semiconductor devices.

Much of the heat generated by semiconductor devices tends to build up within the semiconducting layers, thus affecting the efficiency of the device. For example, an LED may consist of a plurality of semiconductor layers arranged to emit light from a light-emitting surface. As they have become increasingly important in electronics and lighting devices, LEDs continue to be developed that have ever increasing power requirements. This trend of increasing power has created cooling problems for such devices. These cooling problems can be exacerbated by the typically small size of these devices, which may render heat sinks with traditional aluminum heat fins ineffective due to their bulky nature. Additionally, such traditional heat sinks block the emission of light if applied to the light-emitting surface of the LED. Because heat sinks cannot interfere with the function of the semiconductor layers or the light-emitting surface, they are often located at the junction between the LED and a supporting structure such as a circuit board. Such a heat sink location is relatively remote from the accumulation of much of the heat, namely, the light-emitting surface and the semiconductor layers.

It has been discovered that forming a diamond layer within the LED package allows adequate cooling even at high power, while at the same time maintaining a small LED package size. Additionally, in one aspect the maximum operating wattage of an LED may be exceeded by drawing heat from the semiconductor layers of the LED with a diamond layer in order to operate the LED at an operating wattage that is higher than the maximum operating wattage for that LED.

Additionally, in both semiconductor devices that emit light and those that don't, heat may be trapped within the semiconducting layers due to the relatively poor thermal conductivity of materials that often make up these layers. Additionally, crystal lattice mismatches between semiconductive layers slow the conduction of heat, thus facilitating further heat buildup. Semiconductor devices have now been developed incorporating layers of diamond that provide, among other things, improved cooling properties to the device. Such layers of diamond increase the flow of heat laterally through the semiconductor device to thus reduce the amount of heat trapped within the semiconductor layers. This lateral heat transmission may thus effectively improve the thermal properties of many semiconductor devices. Furthermore, devices according to aspects of the present invention have increased lattice matching, thus further improving their thermal cooling properties. Additionally, it should be noted that the beneficial properties provided by diamond layers may extend beyond cooling, and as such, the present scope should not be limited thereto.

More effective cooling can be achieved within a semiconductor device if diamond layers can be incorporated close to the semiconducting layers. One barrier to integration concerns the high dielectric properties of diamond materials, particularly those that have substantially single crystal lattice configurations. Optimum cooling conditions may be achieved if the diamond layer is within the conductive pathway of the semiconductor device, however such configurations have been difficult to achieve due to the dielectric properties of diamond. It has now been discovered that a conductive diamond layer can function as an electrode and be coupled to semiconductor layers and thus be within the conductive pathway of the device.

Additionally, by utilizing a conductive diamond layer as an electrode, LED devices can be constructed having a linear conductive pathway through the semiconductive layers between the electrodes. Many prior LED devices were constructed such that the conductive pathway from the n-type electrode was at a right angle to the conductive pathway from the p-type electrode. Such an "L" shaped conductive pathway caused electrons and holes to be oriented at right angles to one another, thus reducing the efficiency of the device. The linear conductive pathway according to aspects of the present invention causes electrons and holes to be oriented along the same linear pathway, thus improving the efficiency of the LED device.

Accordingly, in one aspect of the present invention, an LED device is provided. As is shown in FIG. 1, such a device may include a conductive diamond layer 12, a SiC layer or AlN layer 14 coupled to the conductive diamond layer 12, a plurality of semiconductor layers 16, at least one of which is coupled to the SiC layer or AlN layer 14, and an n-type electrode 18 coupled to at least one of the plurality of semiconductor layers 16. In such a device, the conductive diamond layer 12 functions as a p-type electrode.

Figure 2:
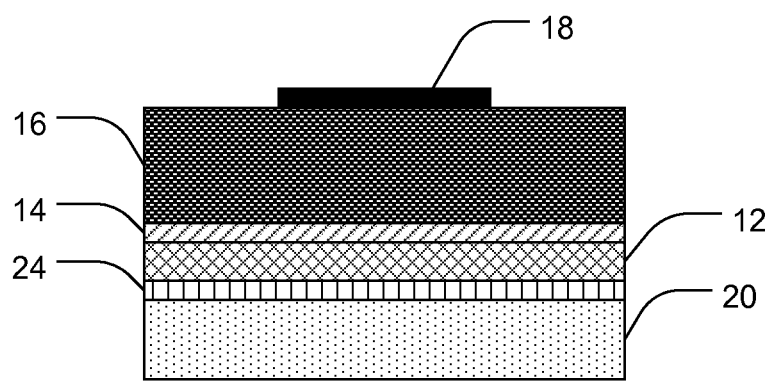
FIG. 2 is a cross-section view of an LED device in accordance with one embodiment of the present invention.

In another aspect of the present invention, as is shown in FIG. 2, a support substrate 20 may be coupled to the device for convenience in handling and use. A reflector layer 24 may be formed between the conductive diamond layer 12 and the support substrate 20 to reflect light back through the conductive diamond layer 12 to improve the efficiency of the LED device. Such a reflective layer may be formed from a variety of reflective materials that are known to those of ordinary skill in the art. One example of such a reflective material would be a layer of chromium metal or other reflective metal.

Figure 3:
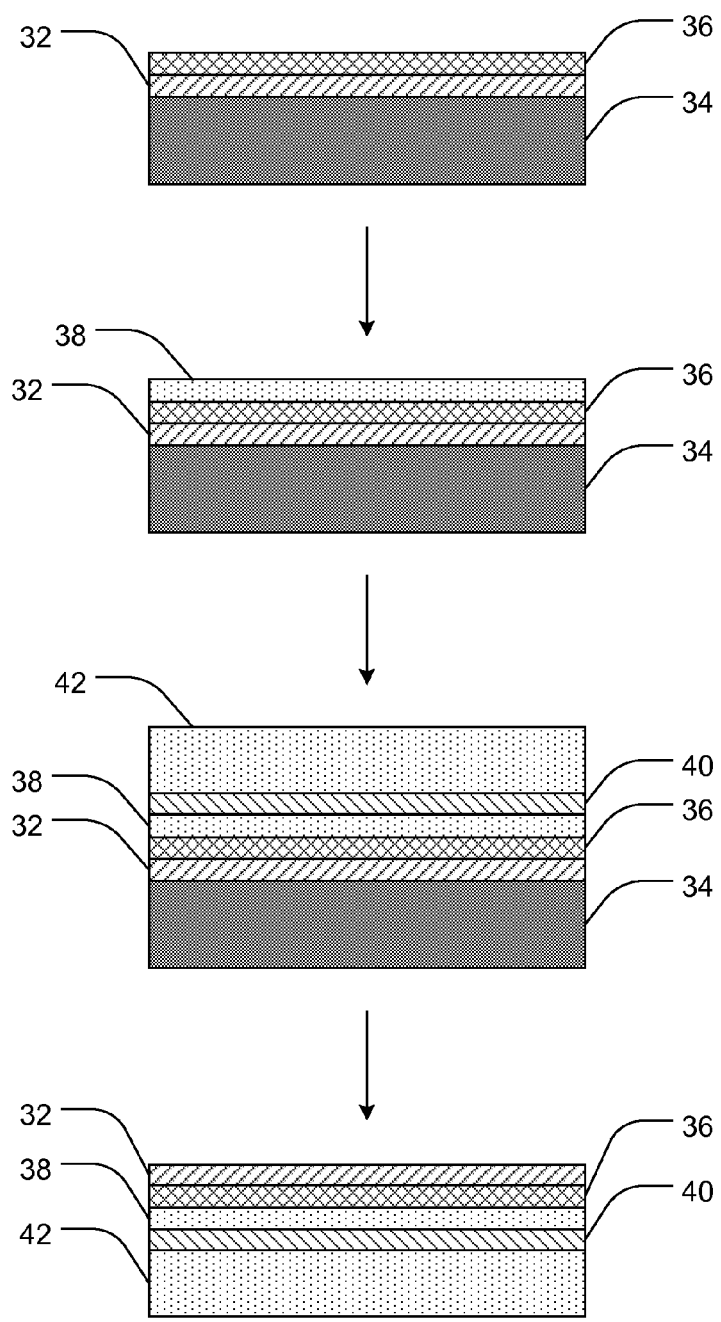
FIG. 3 is a cross-section view of selected steps in the formation of an LED device in accordance with one embodiment of the present invention.

FIG. 3 shows selected steps of a method constructing a semiconductor substrate that may be used to form an LED device according to particular aspects of the present invention. A single crystal Si growth substrate 34 is provided upon which other materials are formed. Although it is not required that the Si growth substrate be single crystal, such a single crystal lattice configuration may facilitate deposition of additional materials with fewer lattice mismatches as compared to a non-single crystal substrate. It may be beneficial to thoroughly clean the Si growth substrate to remove any non-crystalline Si or non-Si particles from the wafer prior to deposition that may affect the lattice mismatch between the Si growth substrate and the layers formed thereon. Any method of cleaning the Si growth substrate would be considered to be within the present scope, however, in one aspect the substrate can be soaked in KOH and ultrasonically cleaned with distilled water.

Following cleaning of the Si growth substrate 34, an epitaxial layer of single crystal SiC 32 and an epitaxial diamond layer 36 may be formed thereon, such that the single crystal SiC layer 32 is located between the Si growth substrate 34 and the diamond layer 36. The SiC layer may be formed separately from the diamond layer, or it may be formed as a result of, or in conjunction with, the deposition of the diamond layer. For example, the SiC layer may be formed as a result of a gradation process from Si to diamond, as is described below. Additionally, the SiC layer may be created in vivo by the deposition of an amorphous diamond layer onto the Si growth substrate, as is also described below.

Subsequently, a Si layer 38 may be formed on the diamond layer 36. The Si layer 38 improves the bonding of the Si carrier substrate 42 to the diamond layer 36. The Si carrier substrate 42 has a $SiO_2$ layer for bonding to the Si layer 38. Following the wafer bonding of the Si carrier substrate 42 to the Si layer 38, the Si growth substrate 34 may be removed to expose the SiC layer 32. As has been described, the SiC layer 32 may be used as a growth surface for the deposition of semiconductor materials. In one aspect, following formation of the LED layers on the SiC layer 32, the Si carrier substrate 42 and the Si layer 38 may be removed to expose the conductive diamond layer. A support substrate and/or a reflective layer may then be applied to the conductive diamond layer as is described herein.

In addition to the foregoing, in some embodiments of the invention, AlN may be substituted for the SiC layer and used between the Si layer and the diamond layer. In this event, either diamond (i.e. carbon) or Si may be used to grade to an AlN layer. One example of a gradation technique that may be used is Atomic Layer Deposition (ALD). Using such technique layers of varying material concentration may be graded (layer gradation) from the starting material to the finish material. For example, beginning with the Si layer, one part of AlN may be codeposited with Si, and then in a subsequent layer, two parts AlN may be included, and so on, until a layer with a substantially even distribution of Si and AlN is produced. Such a gradation produces a super lattice. Such techniques can further be used to transition from diamond (i.e. carbon) to AlN. Other semiconductor materials, such as GaN can then be added to the AlN. In some aspects, the AlN may be amorphous and serve as a buffer layer to other nitride materials.

Diamond materials have excellent thermal conductivity properties that make them ideal for incorporation into semiconductor devices, such as LEDs. The transfer of heat that is present in the semiconductor device can thus be accelerated from the device through a diamond material. It should be noted that the present invention is not limited as to specific theories of heat transmission. As such, in one aspect the accelerated movement of heat from inside the device can be at least partially due to heat movement into and through a diamond layer. Due to the heat conductive properties of diamond, heat can rapidly spread laterally through the diamond layer and to the edges of a semiconductor device. Heat present around the edges will be more rapidly dissipated into the air or into surrounding structures, such as heat spreaders or device supports. Additionally, diamond layers having a major portion of surface area exposed to air will more rapidly dissipate heat from a device in which such a layer is incorporated. Because the thermal conductivity of diamond is greater than the thermal conductivity of a semiconductor layer or other structure to which it is thermally coupled, a heat sink is established by the diamond layer. As such, heat that builds up in the semiconductor layer is drawn into the diamond layer and spread laterally to be discharged from the device. Such accelerated heat transfer may result in semiconductor devices with much cooler operational temperatures. Additionally, the acceleration of heat transfer not only cools a semiconductor device, but may also reduce the heat load on many electronic components that are spatially located nearby the semiconductor device.

In some aspects of the present invention, a portion of a diamond layer may be exposed to the air. Such exposure may be limited to the edges of the layer in some cases, or it may be a larger proportion of surface area, such as would be the case for a diamond layer having one side exposed. In such aspects, the accelerated movement of heat away from a semiconductor layer may be at least partially due to heat movement from the diamond layer to air. For example, a diamond material such as diamond-like carbon (DLC) has exceptional heat emissivity characteristics even at temperatures below 100° C., and as such, may effectively radiate heat directly to the air. Many semiconductor materials that comprise a device conduct heat much better than they emit heat. As such, heat can be conducted through a semiconductor material to a DLC layer, spread laterally through the DLC layer, and subsequently emitted to the air along the edges or other exposed surfaces. Due to the high heat conductive and radiative properties of DLC, heat movement from the DLC layer to air can be greater than heat movement from the semiconductor layer to air. Also, heat movement from the semiconductor device to the DLC layer can be greater than heat movement from the semiconductor device to the air. As such, the layer of DLC can serve to accelerate heat transfer away from the semiconductor layer more rapidly than heat can be transferred through the semiconductor device itself, or from the semiconductor device to the air.

As has been suggested, various diamond materials may be utilized to provide accelerated heat transferring properties to a semiconductor device. Non-limiting examples of such diamond materials may include diamond, DLC, amorphous diamond, and combinations thereof. It should be noted, however, that any form of natural or synthetic diamond material that may be utilized to cool a semiconductor device is considered to be within the present scope.

It should be understood that the following is a very general discussion of diamond deposition techniques that may or may not apply to a particular diamond layer or application, and that such techniques may vary widely between the various aspects of the present invention. Generally, diamond layers may be formed by any means known, including various vapor deposition techniques. Any number of known vapor deposition techniques may be used to form these diamond layers. The most common vapor deposition techniques include chemical vapor deposition (CVD) and physical vapor deposition (PVD), although any similar method can be used if similar properties and results are obtained. In one aspect, CVD techniques such as hot filament, microwave plasma, oxyacetylene flame, rf-CVD, laser CVD (LCVD), metal-organic CVD (MOCVD), laser ablation, conformal diamond coating processes, and direct current arc techniques may be utilized. Typical CVD techniques use gas reactants to deposit the diamond or diamond-like material in a layer, or film. These gases generally include a small amount (i.e. less than about 5%) of a carbonaceous material, such as methane, diluted in hydrogen. A variety of specific CVD processes, including equipment and conditions, as well as those used for boron nitride layers, are well known to those skilled in the art. In another aspect, PVD techniques such as sputtering, cathodic arc, and thermal evaporation may be utilized. Further, specific deposition conditions may be used in order to adjust the exact type of material to be deposited, whether DLC, amorphous diamond, or pure diamond. It should also be noted that many semiconductor devices such as LEDs may be degraded by high temperature. Care may need to be taken to avoid damage during diamond deposition by forming at lower temperatures. For example, if the semiconductor contains InN, deposition temperatures of up to about 600° C. may be used. In the case of GaN, layers may be thermally stable up to about 1000° C. Additionally, preformed layers can be brazed, glued, or otherwise affixed to the semiconductor layer or to a support substrate of the semiconductor device using methods which do not unduly interfere with the heat transference of the diamond layer or the functionality of the device.

An optional nucleation enhancing layer can be formed on the growth surface of a substrate in order to improve the quality and deposition time of a diamond layer. Specifically, a diamond layer can be formed by depositing applicable nuclei, such as diamond nuclei, on a diamond growth surface of a substrate and then growing the nuclei into a film or layer using a vapor deposition technique. In one aspect of the present invention, a thin nucleation enhancer layer can be coated upon the substrate to enhance the growth of the diamond layer. Diamond nuclei are then placed upon the nucleation enhancer layer, and the growth of the diamond layer proceeds via CVD.

A variety of suitable materials will be recognized by those in skilled in the art which can serve as a nucleation enhancer. In one aspect of the present invention, the nucleation enhancer may be a material selected from the group consisting of metals, metal alloys, metal compounds, carbides, carbide formers, and mixtures thereof. Examples of carbide forming materials may include, without limitation, tungsten (W), tantalum (Ta), titanium (Ti), zirconium (Zr), chromium (Cr), molybdenum (Mo), silicon (Si), and manganese (Mn). Additionally, examples of carbides include tungsten carbide (WC), silicon carbide (SiC), titanium carbide (TiC), zirconium carbide (ZrC), and mixtures thereof among others.

The nucleation enhancer layer, when used, is a layer which is thin enough that it does not to adversely affect the thermal transmission properties of the diamond layer. In one aspect, the thickness of the nucleation enhancer layer may be less than about 0.1 micrometers. In another aspect, the thickness may be less than about 10 nanometers. In yet another aspect, the thickness of the nucleation enhancer layer is less than about 5 nanometers. In a further aspect of the invention, the thickness of the nucleation enhancer layer is less than about 3 nanometers.

Various methods may be employed to increase the quality of the diamond in the nucleation surface of the diamond layer which is created by vapor deposition techniques. For example, diamond particle quality can be increased by reducing the methane flow rate, and increasing the total gas pressure during the early phase of diamond deposition. Such measures, decrease the decomposition rate of carbon, and increase the concentration of hydrogen atoms. Thus a significantly higher percentage of the carbon will be deposited in a $sp^3$ bonding configuration, and the quality of the diamond nuclei formed is increased. Additionally, the nucleation rate of diamond particles deposited on the growth surface of the substrate or the nucleation enhancer layer may be increased in order to reduce the amount of interstitial space between diamond particles. Examples of ways to increase nucleation rates include, but are not limited to; applying a negative bias in an appropriate amount, often about 100 volts, to the growth surface; polishing the growth surface with a fine diamond paste or powder, which may partially remain on the growth surface; and controlling the composition of the growth surface such as by ion implantation of C, Si, Cr, Mn, Ti, V, Zr, W, Mo, Ta, and the like by PVD or PECVD. PVD processes are typically at lower temperatures than CVD processes and in some cases can be below about 200° C. such as about 150° C. Other methods of increasing diamond nucleation will be readily apparent to those skilled in the art.

In one aspect of the present invention, the diamond layer may be formed as a conformal diamond layer. Conformal diamond coating processes can provide a number of advantages over conventional diamond film processes. Conformal diamond coating can be performed on a wide variety of substrates, including non-planar substrates. A growth surface can be pretreated under diamond growth conditions in the absence of a bias to form a carbon film. The diamond growth conditions can be conditions that are conventional CVD deposition conditions for diamond without an applied bias. As a result, a thin carbon film can be formed which is typically less than about 100 angstroms. The pretreatment step can be performed at almost any growth temperature such as from about 200° C. to about 900° C., although lower temperatures below about 500° C. may be preferred. Without being bound to any particular theory, the thin carbon film appears to form within a short time, e.g., less than one hour, and is a hydrogen terminated amorphous carbon.

Following formation of the thin carbon film, the growth surface may then be subjected to diamond growth conditions to form a conformal diamond layer. The diamond growth conditions may be those conditions which are commonly used in traditional CVD diamond growth. However, unlike conventional diamond film growth, the diamond film produced using the above pretreatment steps results in a conformal diamond film that typically begins growth substantially over the entire growth surface with substantially no incubation time. In addition, a continuous film, e.g. substantially no grain boundaries, can develop within about 80 nm of growth. Diamond layers having substantially no grain boundaries may move heat more efficiently than those layers having grain boundaries.

Various techniques may be employed to render a diamond layer conductive. Such techniques are known to those of ordinary skill in the art. For example, various impurities may be doped into the crystal lattice of the diamond layer. Such impurities may include elements such as Si, B, P, N, Li, Al, Ga, etc. In one specific aspect, for example, the diamond layer may be doped with B. Impurities may also include metallic particles within the crystal lattice, provided they do not interfere with the function of the device, such as by blocking light emitted from an LED.

For some diamond layers, particularly those on which semiconductor layers are to be formed, it may be beneficial to create a growth substrate upon which the semiconductor material can be formed with minimal crystal lattice dislocations as a substantially single crystal. Minimizing crystal lattice dislocations may be facilitated by utilizing a growth substrate that is substantially a single crystal and has properties such that strong bonding interactions with the semiconductor material may be achieved. In one aspect, such a substrate includes a substantially single crystal diamond layer having a substantially single crystal SiC layer epitaxially coupled thereto. The substantially single crystal nature of the SiC layer facilitates the deposition of a semiconductor such as GaN or AlN as a substantially single crystal. Additionally, the epitaxial relationship from the diamond layer through the SiC layer and to the semiconductor layer increases thermal conduction to the diamond layer, thus improving the cooling properties of the device.

Various methods are possible for building such a diamond/SiC composite substrate. Any such method would be considered to be within the scope of the present invention. For example, in one aspect such a substrate may be created by grading a single crystal Si wafer into a single crystal diamond layer. In other words, the Si wafer would gradually transition from Si to SiC and then to diamond. Techniques for such grading are further discussed in the Applicant's copending U.S. patent application Ser. No. 11/809,806 which is incorporated herein by reference. Other methods of growing one material on another or otherwise attaching two materials together are also found in Applicant's copending U.S. patent application Ser. Nos. 11/809,718; 11/809,721; 61/187,557; 61/230,055; and 61/259,948, each of which are incorporated herein by reference. In addition to the above described benefits of minimizing crystal dislocations, substantially single crystal diamond layers are substantially transparent to light and are thus useful in constructing light-emitting semiconductor devices such as LEDs and laser diodes.

Following thickening of the diamond layer or attachment of a support substrate to the diamond layer, the Si wafer may be removed by any method know to one of ordinary skill in the art. The resulting structure includes a substantially single crystal diamond layer having a substantially single crystal SiC layer epitaxially coupled thereto. A semiconductor material may then be epitaxially formed on the SiC layer by any method know to one of ordinary skill in the art. In one aspect such deposition may occur in a graded manner similar to the techniques used in forming the diamond layer on the Si wafer.

The diamond layers according to aspects of the present invention may be of any thickness that would allow thermal cooling of a semiconductor device. Thicknesses may vary depending on the application and the semiconductor device configuration. For example, greater cooling requirements may require thicker diamond layers. The thickness may also vary depending on the material used in the diamond layer. That being said, in one aspect a diamond layer may be from about 10 to about 50 microns thick. In another example, a diamond layer may be less than or equal to about 10 microns thick. In yet another example, a diamond layer may be from about 50 microns to about 100 microns thick. In a further example, a diamond layer may be greater than about 50 microns thick. In yet a further example, a diamond layer may be an adynamic diamond layer.

SiC layers according to aspects of the present invention may have a variety of thicknesses, depending on the method of deposition of the SiC layer and the intended uses of the device. In some aspects the SiC layer may be merely thick enough to orient the crystal lattice of the layers being formed thereon. In other aspects, thicker SiC layers may be beneficial. With such variation in mind, in one aspect the SiC layer may be less than or equal to about 1 micron thick. In another aspect, the SiC layer may be less than or equal to about 500 nanometers thick. In yet another aspect, the SiC layer may be less than or equal to about 1 nanometer thick. In a further aspect, the SiC layer may be greater than about 1 micron thick.

As has been described, the semiconductor devices according to aspects of the present invention include a plurality of semiconductor layers associated with one or more diamond layers. These semiconductor layers may be associated with a diamond layer by a variety of methods known to one of ordinary skill in the art. In one aspect of the present invention, however, one or more semiconductor layers may be formed on a diamond layer, or as is described above, on a SiC layer coupled to a diamond layer.

A semiconductor layer may be formed on a substrate such as a SiC layer using a variety of techniques known to those of ordinary skill in the art. One example of such a technique is a MOCVD process.

The semiconductor layer may include any material that is suitable for forming electronic devices, semiconductor devices, or the like. Many semiconductors are based on silicon, gallium, indium, and germanium. However, suitable materials for the semiconductor layer can include, without limitation, silicon, silicon carbide, silicon germanium, gallium arsenide, gallium nitride, germanium, zinc sulfide, gallium phosphide, gallium antimonide, gallium indium arsenide phosphide, aluminum phosphide, aluminum arsenide, aluminum gallium arsenide, gallium nitride, boron nitride, aluminum nitride, indium arsenide, indium phosphide, indium antimonide, indium nitride, and composites thereof. In one aspect, however, the semiconductor layer can include silicon, silicon carbide, gallium arsenide, gallium nitride, gallium phosphide, aluminum nitride, indium nitride, indium gallium nitride, aluminum gallium nitride, or composites of these materials.

In some additional embodiments, non-silicon based devices can be formed such as those based on gallium arsenide, gallium nitride, germanium, boron nitride, aluminum nitride, indium-based materials, and composites thereof. In another embodiment, the semiconductor layer can comprise gallium nitride, indium gallium nitride, indium nitride, and combinations thereof. In one specific aspect, the semiconductor material is gallium nitride. In another specific aspect, the semiconductor material is aluminum nitride. Other semiconductor materials which can be used include $Al_2O_3$, BeO, W, Mo, c-$Y_2O_3$, c-$(Y_{0.9}La_{0.1})_2O_3$, c-$Al_{23}O_{27}N_5$, c-$MgAl_2O_4$, t-$MgF_2$, graphite, and mixtures thereof. It should be understood that the semiconductor layer may include any semiconductor material known, and should not be limited to those materials described herein. Additionally, semiconductor materials may be of any structural configuration known, for example, without limitation, cubic (zincblende or sphalerite), wurtzitic, rhombohedral, graphitic, turbostratic, pyrolytic, hexagonal, amorphous, or combinations thereof. As has been described, the semiconductor layer 14 may be formed by any method known to one of ordinary skill in the art. Various known methods of vapor deposition can be utilized to deposit such layers and that allow deposition to occur in a graded manner. Additionally, surface processing may be performed between any of the deposition steps described in order to provide a smooth surface for subsequent deposition. Such processing may be accomplished by any means known, such as by chemical etching, polishing, buffing, grinding, etc.

In one aspect of the present invention, at least one of the semiconductor layers may be gallium nitride (GaN). GaN semiconductor layers may be useful in constructing LEDs and other semiconductor devices. In some cases it may be beneficial to gradually transition between the SiC or other substrate and the semiconductor layer. For example, gradually transitioning an indium nitride (InN) semiconductor substrate into a GaN semiconductor layer may occur by fixing the concentration of the N being vapor deposited and varying the deposited concentration of Ga and of In such that a ratio of Ga:In gradually transitions from about 0:1 to about 1:0. In other words, the sources of Ga and In are varied such that as the In concentration is decreased, the Ga concentration is increased. The gradual transition functions to greatly reduce the lattice mismatch observed when forming GaN directly on InN.

In another aspect, at least one of the semiconductor layers may be a layer of aluminum nitride (AlN). The AlN layer may be deposited on a substrate by any means known to one of ordinary skill in the art. As with the GaN layer described above, gradually transitioning between semiconductor layers may improve the functionality of the semiconductor device. For example, in one aspect AlN may be formed on a semiconductor substrate of InN by gradually transitioning the layer of InN into the layer of AlN. Such a gradual transition may include, for example, gradually transitioning the layer of InN into the layer of AlN by fixing the concentration of N being deposited and varying the deposited concentration of In and of Al such that a ratio of In:Al gradually transitions from about 0:1 to about 1:0. Such a gradual transition may greatly reduce the lattice mismatch observed when forming AlN on InN directly. Surface processing may be performed between any of the deposition steps described in order to provide a smooth surface for subsequent deposition. Such processing may be accomplished by any means known, such as by chemical etching, polishing, buffing, grinding, etc.

As has been described, an n-type electrode is incorporated into an LED device as an electrical contact for the semiconductive layers. N-type electrodes, including their use and formation, are well known to those of ordinary skill in the art, and will not be discussed in detail herein.

EXAMPLES

The following examples illustrate various techniques of making a semiconductor device such as an LED according to aspects of the present invention. However, it is to be understood that the following are only exemplary or illustrative of the application of the principles of the present invention. Numerous modifications and alternative compositions, methods, and systems can be devised by those skilled in the art without departing from the spirit and scope of the present invention. The appended claims are intended to cover such modifications and arrangements. Thus, while the present invention has been described above with particularity, the following Examples provide further detail in connection with several specific embodiments of the invention.

Example 1

A semiconductor substrate may be formed as follows:

A single crystal Si wafer is obtained and cleaned by soaking in KOH and ultrasound cleaning with distilled water to remove any non-crystalline Si and foreign debris. A conformal amorphous carbon coating is applied to the cleaned surface of the Si wafer by exposing the wafer to CVD deposition conditions without an applied bias. Following carbonization of the surface, amorphous diamond is deposited for approximately 30 minutes at 800° in 1% $CH_4$ and 99% $H_2$. The amorphous carbon coating is then removed with $H_2$ or $F_2$ treatment for about 60 minutes, at 900°. Removal of the amorphous carbon coating exposes an epitaxial SiC layer that has formed in situ between the Si wafer and the amorphous carbon coating. The thickness of the SiC layer is approximately 10 nm.

A transparent diamond coating 10 microns thick is then deposited onto the SiC layer by CVD deposition of $CH_4$ for approximately 10 hours. After 10 hours, the $CH_4$ source is then switched to $SiH_4$ for approximately 10 minutes to deposit a 1 micron thick Si layer.

A Si carrier substrate having a $SiO_2$ surface is wafer bonded to the 1 micron thick Si layer at the $SiO_2$ surface. Following wafer bonding, the single crystal Si wafer is removed to expose the SiC layer by etching with HF+$3HNO_2$+$H_2O$. Further details regarding etching Si materials may be found in U.S. Pat. No. 4,981,818, which is incorporated herein by reference.

Example 2

An LED device may be constructed as follows:

A semiconductor substrate is obtained as in Example 1. GaN semiconductor layers are deposited onto the exposed SiC layer by MOCVD with $GaH_3$ and $NH_3$ source materials.

Of course, it is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A method of making an LED device, comprising:
   forming epitaxially a SiC or AlN layer on a substantially single crystal Si wafer;
   forming epitaxially a substantially single crystal diamond layer on the SiC or AlN layer;
   doping the diamond layer to form a conductive diamond layer;
   removing the Si wafer to expose the SiC or AlN layer opposite to the diamond layer;
   forming epitaxially a plurality of semiconductor layers on the SiC or AlN layer such that at least one of the semiconductive layers contacts the SiC or AlN layer; and
   coupling an n-type electrode to at least one of the semiconductor layers, such that the plurality of semiconductor layers is functionally located between the conductive diamond layer and the n-type electrode, and where the conductive diamond layer and the n-type electrode are arranged such that there is a substantially linear conductive pathway therebetween.

2. The method of claim 1, wherein forming an epitaxial layer of a substantially single crystal diamond layer further includes compositionally grading a surface of the Si wafer from Si to SiC or AlN to form the SiC or AlN layer, and compositionally grading a surface of the SiC or AlN layer to diamond to form the diamond layer.

3. The method of claim 2, wherein forming an epitaxial layer of SiC further includes:
   forming a conformal amorphous diamond layer on the Si growth substrate to form the SiC layer in situ therebetween; and
   removing the conformal amorphous diamond layer to expose the SiC layer.

4. The method of claim 3, further comprising forming the conductive diamond layer on the exposed SiC layer.

5. The method of claim 1, further comprising:
   forming a Si layer on the diamond layer on a surface opposite the SiC or AlN layer prior to removing the Si wafer; and
   bonding a Si carrier substrate having a $SiO_2$ layer to the Si layer, such that the Si layer is bonded to the $SiO_2$ layer.

* * * * *